US010756150B2

(12) United States Patent
Lee et al.

(10) Patent No.: US 10,756,150 B2
(45) Date of Patent: Aug. 25, 2020

(54) THIN-FILM TRANSISTOR SUBSTRATE AND DISPLAY DEVICE INCLUDING THE SAME

(71) Applicant: Samsung Display Co., Ltd., Yongin-si, Gyeonggi-do (KR)

(72) Inventors: Sun Hee Lee, Hwaseong-si (KR);
Younggug Seol, Hwaseong-si (KR);
Sunho Kim, Seongnam-si (KR);
Sangho Park, Hwaseong-si (KR);
Juchan Park, Seoul (KR); Joosun Yoon, Seoul (KR); Jonghyuk Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 48 days.

(21) Appl. No.: 15/834,711

(22) Filed: Dec. 7, 2017

(65) Prior Publication Data

US 2018/0286936 A1 Oct. 4, 2018

(30) Foreign Application Priority Data

Mar. 31, 2017 (KR) .................. 10-2017-0041426

(51) Int. Cl.
*H01L 27/32* (2006.01)
*H01L 51/52* (2006.01)
*H01L 51/00* (2006.01)
*H01L 29/78* (2006.01)
*H01L 29/786* (2006.01)
(Continued)

(52) U.S. Cl.
CPC ........ *H01L 27/3258* (2013.01); *H01L 27/124* (2013.01); *H01L 27/1222* (2013.01); *H01L 27/1255* (2013.01); *H01L 27/14623* (2013.01); *H01L 27/14818* (2013.01); *H01L 27/3262* (2013.01); *H01L 27/3272* (2013.01); *H01L 29/7842* (2013.01); *H01L 29/78603* (2013.01); *H01L 29/78633* (2013.01); *H01L 51/0097* (2013.01); *H01L 51/524* (2013.01); *H01L 51/5212* (2013.01); *H01L 51/5221* (2013.01); *H01L 2251/5338* (2013.01)

(58) Field of Classification Search
CPC ............ H01L 27/3258; H01L 27/3262; H01L 51/0097; H01L 51/5212; H01L 27/124; H01L 29/78633; H01L 27/14818; H01L 27/14623; H01L 27/3272
See application file for complete search history.

(56) References Cited

U.S. PATENT DOCUMENTS

2001/0026257 A1* 10/2001 Kimura ................ G09G 3/2022
345/87
2002/0013046 A1* 1/2002 Koganei ............... H01L 21/312
438/623

(Continued)

FOREIGN PATENT DOCUMENTS

KR 10-1155907 B1 6/2012
KR 10-2014-0020672 A 2/2014
KR 10-2014-0077624 A 6/2014

*Primary Examiner* — Feifei Yeung Lopez
(74) *Attorney, Agent, or Firm* — Lewis Roca Rothgerber Christie LLP

(57) ABSTRACT

A thin-film transistor substrate may include a substrate, a transistor on the substrate, and including an active pattern, and a gate electrode insulated from the active pattern, and a first protection member on the transistor, and overlapping the transistor in a plan view.

17 Claims, 12 Drawing Sheets

(51) Int. Cl.
*H01L 27/12* (2006.01)
*H01L 27/148* (2006.01)
*H01L 27/146* (2006.01)

(56) References Cited

U.S. PATENT DOCUMENTS

| | | | |
|---|---|---|---|
| 2004/0017442 A1* | 1/2004 | Hirasawa | B41J 2/14233 347/72 |
| 2004/0164418 A1* | 8/2004 | Sugiura | H01L 23/522 257/758 |
| 2006/0028763 A1* | 2/2006 | Matono | G11B 5/1278 360/125.57 |
| 2006/0065330 A1* | 3/2006 | Cooper | B22F 3/1112 148/538 |
| 2007/0056377 A1* | 3/2007 | Matsubara | G01L 9/0042 73/718 |
| 2007/0107228 A1* | 5/2007 | Nagai | F16C 29/005 29/898.03 |
| 2009/0264036 A1* | 10/2009 | Yano | D21H 11/08 442/165 |
| 2012/0061675 A1* | 3/2012 | Yamamoto | H01L 27/1214 257/59 |
| 2016/0211314 A1* | 7/2016 | Kim | H01L 27/3276 |
| 2017/0162610 A1* | 6/2017 | Zhang | H01L 21/02532 |

* cited by examiner

THIN-FILM TRANSISTOR SUBSTRATE AND DISPLAY DEVICE INCLUDING THE SAME

CROSS-REFERENCE TO RELATED APPLICATION

This application claims priority to, and the benefit of, Korean Patent Application No. 10-2017-0041426, filed on Mar. 31, 2017 in the Korean Intellectual Property Office (KIPO), the entire disclosure of which is incorporated by reference herein.

BACKGROUND

1. Field

Embodiments relate to thin-film transistor substrates, and display devices including the thin-film transistor substrates.

2. Description of the Related Art

A display device may include a thin-film transistor substrate including at least one thin-film transistor, a light emitting element of which light emission is controlled by the thin-film transistor, and an encapsulation member protecting the light emitting element.

Thickness of the display device has been decreasing as technology has advanced. Recently, research on a flexible display device that can be bent or folded has been conducted. However, according to the decreasing of the thickness of the display device, possibility of damage of the thin-film transistor caused by impact applied from the outside may increase. When the flexible display device is deformed, stress applied to the thin-film transistor may increase.

SUMMARY

Embodiments of the present disclosure provide a thin-film transistor substrate in which stress applied to the thin-film transistor may be reduced.

Embodiments of the present disclosure provide a display device in which stress applied to a thin-film transistor may be reduced.

According to an embodiment of the present disclosure, a thin-film transistor substrate includes a substrate, a transistor on the substrate, and including an active pattern, and a gate electrode insulated from the active pattern, and a first protection member on the transistor, and overlapping the transistor in a plan view.

The active pattern may include a channel region, a source region, and a drain region, and the first protection member may be on the channel region to correspond to the channel region in a plan view.

The first protection member may include one of a metal and an inorganic insulating material.

The thin-film transistor substrate may further include a data line and a driving voltage line above the gate electrode for respectively transmitting a data signal and a driving voltage.

The first protection member may be on a same level as the data line and the driving voltage line, and the first protection member may protrude from one of the data line and the driving voltage line.

The first protection member may be in contact with an upper portion or a lower portion of one of the data line and the driving voltage line.

The thin-film transistor substrate may further include a first planarization layer on the first protection member, wherein an elastic modulus of the first protection member is greater than an elastic modulus of the first planarization layer.

The thin-film transistor substrate may further include a second protection member on the first planarization layer and overlapping the transistor in a plan view.

The thin-film transistor substrate may further include a second planarization layer on the second protection member, wherein an elastic modulus of the second protection member is greater than an elastic modulus of the second planarization layer.

The second protection member may include one of a metal and an inorganic insulating material.

The first planarization layer may include an organic insulating material.

The substrate may include a first flexible layer, and a second flexible layer on the first flexible layer, wherein the thin-film transistor substrate further includes a second protection member between the first flexible layer and the second flexible layer, and overlapping the transistor in a plan view.

An elastic modulus of the second protection member is greater than an elastic modulus of the second flexible layer.

The thin-film transistor substrate may further include a buffer layer between the substrate and the active pattern, and a second protection member between the substrate and the buffer layer, the second protection member overlapping the transistor in a plan view.

An elastic modulus of the second protection member may be greater than an elastic modulus of the buffer layer.

According to an embodiment of the present disclosure, a display device includes a substrate, a scan line on the substrate for transmitting a scan signal, a data line and a driving voltage line crossing the scan line for respectively transmitting a data signal and a driving voltage, a first transistor coupled to the scan line and the data line, and including a first active pattern, and a first gate electrode insulated from the first active pattern, a second transistor coupled to the first transistor, and including a second active pattern, and a second gate electrode insulated from the second active pattern, a first protection member on the first transistor, and overlapping the first transistor in a plan view, and a light emitting element coupled to the second transistor.

The first active pattern may include a first channel region, a first source region, and a first drain region, and the first protection member may be on the first channel region to correspond to the first channel region in a plan view.

The first protection member may protrude from one of the data line and the driving voltage line.

The display device may further include a second protection member on the first protection member, and overlapping the first transistor in a plan view.

The display device may further include a second protection member inside the substrate, or between the substrate and the first transistor, the second protection member overlapping the first transistor in a plan view.

Accordingly, the thin-film transistor substrate according to the disclosed embodiments may include a protection member on and/or under the transistor.

Therefore, stress applied to the transistor may decrease. Further, the display device according to the disclosed embodiments may include a protection member on and/or under the transistor, such that stress applied to the transistor may decrease.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
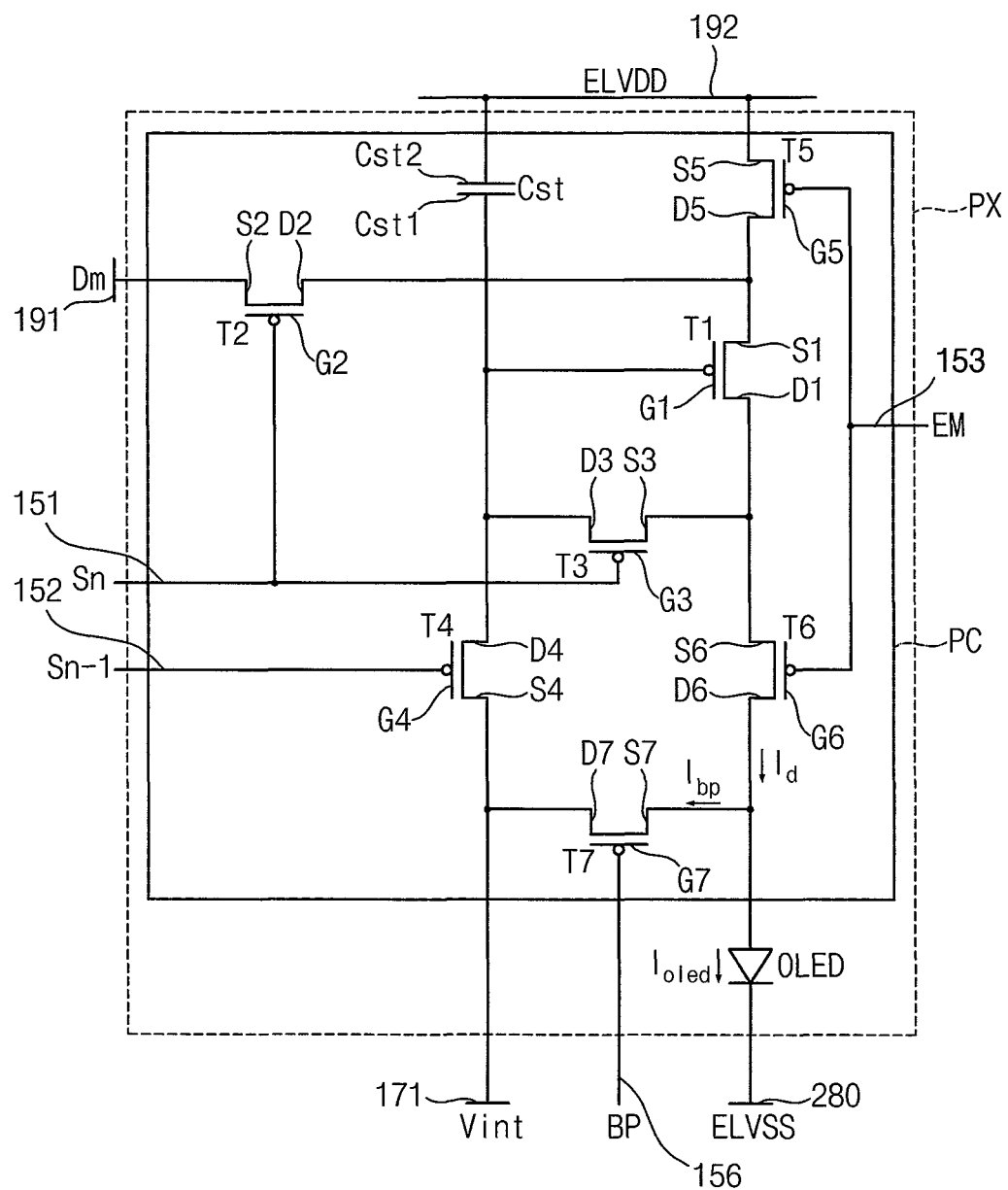
FIG. 1 is an equivalent circuit diagram illustrating a pixel of a display device according to an embodiment.

Hereinafter, thin-film transistor substrates and display devices in accordance with embodiments of the present disclosure will be explained in detail with reference to the accompanying drawings.

In the accompanying drawings, display devices including thin-film transistor substrates of an active matrix (AM) type are illustrated to have a 7-transistor, one-capacitor (7Tr-1Cap) structure in which seven transistors and one capacitor are provided for one pixel, however, the present disclosure is not limited thereto. Thus, in the thin-film transistor substrate, each pixel may be provided with a plurality of transistors and at least one capacitor, and may be formed to have various structures by further forming additional wires or omitting existing wires. In this case, a pixel means a minimum unit which displays an image, and the display device may display an image through a plurality of pixels.

Features of the inventive concept and methods of accomplishing the same may be understood more readily by reference to the following detailed description of embodiments and the accompanying drawings. Hereinafter, embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. In addition, it will also be understood that when an element or layer is referred to as being "between" two elements or layers, it can be the only element or layer between the two elements or layers, or one or more intervening elements or layers may also be present.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

The electronic or electric devices and/or any other relevant devices or components according to embodiments of the present invention described herein may be implemented using any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is an equivalent circuit diagram illustrating a pixel of a display device according to an embodiment.

Referring to FIG. 1, a display device according to an embodiment may include a plurality of signal lines 151, 152, 153, 156, 171, 191, and 192, and a plurality of pixels PX substantially arranged in a matrix form and respectively connected to the plurality of signal lines 151, 152, 153, 156, 171, 191, and 192.

One pixel PX may include a pixel circuit PC and a light emitting element (e.g., an organic light emitting diode (OLED)). The pixel circuit PC may include a plurality of transistors T1, T2, T3, T4, T5, T6, and T7, and a storage capacitor Cst, which are respectively connected to the plurality of signal lines 151, 152, 153, 156, 171, 191, and 192.

The transistors T1, T2, T3, T4, T5, T6, and T7 may include a driving transistor T1, a switching transistor T2, a compensation transistor T3, an initialization transistor T4, an operation control transistor T5, a light emission control transistor T6, and a bypass transistor T7.

The signal lines 151, 152, 153, 156, 171, 191, and 192 may include a scan line 151 transmitting a scan signal Sn, a previous scan line 152 transmitting a previous scan signal Sn−1 to the initialization transistor T4, a light emission control line 153 transmitting a light emission control signal EM to the operation control transistor T5 and to the light emission control transistor T6, a bypass control line 156 transmitting a bypass signal BP to the bypass transistor T7, an initialization voltage line 171 transmitting an initialization voltage Vint, which initializes the driving transistor T1, a data line 191 crossing the scan line 151 and transmitting a data signal Dm, and a driving voltage line 192 transmitting a driving voltage ELVDD and parallel to the data line 191.

A gate electrode G1 of the driving transistor T1 may be connected to one end Cst1 of the storage capacitor Cst, and a source electrode S1 of the driving transistor T1 may be connected to the driving voltage line 192 via the operation control transistor T5. A drain electrode D1 of the driving transistor T1 may be electrically connected to an anode of the organic light emitting diode OLED via the light emission control transistor T6. The driving transistor T1 may receive the data signal Dm according to a switching operation of the switching transistor T2 so as to supply a driving current Id to the organic light emitting diode OLED.

A gate electrode G2 of the switching transistor T2 may be connected to the scan line 151, and a source electrode S2 of the switching transistor T2 may be connected to the data line 191. A drain electrode D2 of the switching transistor T2 may be connected to the source electrode S1 of the driving transistor T1 and to the driving voltage line 192 via the operation control transistor T5. The switching transistor T2 may perform a switching operation so as to be turned on according to the scan signal Sn received through the scan line 151 to transmit the data signal Dm transmitted from the data line 191 to the source electrode S1 of the driving transistor T1.

A gate electrode G3 of the compensation transistor T3 may be directly connected to the scan line 151, and a source electrode S3 of the compensation transistor T3 may be connected to the drain electrode D1 of the driving transistor T1 and connected to the anode of the organic light emitting diode OLED via the light emission control transistor T6. A drain electrode D3 of the compensation transistor T3 may be connected to one end Cst1 of the storage capacitor Cst, to the drain electrode D4 of the initialization transistor T4, and to the gate electrode G1 of the driving transistor T1. The compensation transistor T3 may be turned on according to the scan signal Sn received through the scan line 151 to connect the gate electrode G1 and the drain electrode D1 of the driving transistor T1 to thereby diode-connect the driving transistor T1.

A gate electrode G4 of the initialization transistor T4 may be connected to the previous scan line 152, and a source electrode S4 of the initialization transistor T4 may be connected to the initialization voltage line 171. A drain electrode D4 of the initialization transistor T4 may be connected to one end Cst1 of the storage capacitor Cst, to the gate electrode G1 of the driving transistor T1, and to the drain electrode D3 of the compensation transistor T3. The initialization transistor T4 may perform an initialization operation so as to be turned on according to the previous scan signal Sn−1 received through the previous scan line 152 to transmit the initialization voltage Vint to the gate electrode G1 of the driving transistor T1, and then to initialize a gate voltage Vg of the gate electrode G1 of the driving transistor T1.

A gate electrode G5 of the operation control transistor T5 may be connected to the light emission control line 153, and a source electrode S5 of the operation control transistor T5 may be connected to the driving voltage line 192. A drain electrode D5 of the operation control transistor T5 may be connected to the source electrode S1 of the driving transistor T1 and to the drain electrode D2 of the switching transistor T2.

A gate electrode G6 of the light emission control transistor T6 may be connected to the light emission control line 153, and the source electrode S6 of the light emission control transistor T6 may be connected to the drain electrode D1 of the driving transistor T1 and to the source electrode S3 of the compensation transistor T3. A drain electrode D6 of the light emission control transistor T6 may be electrically connected to the anode of the organic light emitting diode OLED. The operation control transistor T5 and the light emission control transistor T6 may be substantially simultaneously (or concurrently) turned on according to the light emission control signal EM transmitted from the light emission control line 153 such that the driving voltage ELVDD may be compensated through the diode-connected driving transistor T1 and transmitted to the organic light emitting diode OLED.

A gate electrode G7 of the bypass transistor T7 may be connected to the bypass control line 156, and a source electrode S7 of the bypass transistor T7 may be connected to both the drain electrode D6 of the light emission control transistor T6 and the anode of the organic light emitting diode OLED. A drain electrode D7 of the bypass transistor T7 may be connected to both the initialization voltage line 171 and the source electrode S4 of the initialization transistor T4.

The other end Cst2 of the storage capacitor Cst may be connected to the driving voltage line 192. A cathode of the organic light emitting diode OLED may be connected to a common voltage line 280 transmitting a common voltage ELVSS.

In the present embodiment, the seven-transistor and one-capacitor (7Tr-1Cap) structure including the bypass transistor T7 is illustrated. However, the present disclosure is not limited thereto, and the number of transistors and the number of capacitors may be variously changed.

Hereinafter, a detailed operation process of a pixel of the display device according to an embodiment will be described in detail with reference to FIG. 2.

Figure 2:
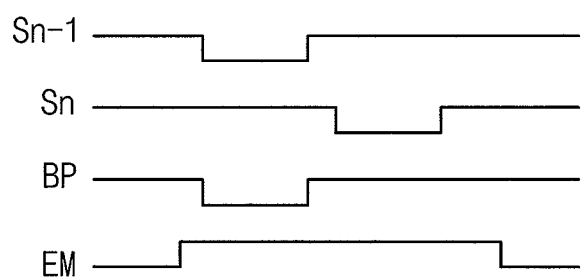
FIG. 2 is a timing diagram illustrating signals applied to a pixel of a display device according to an embodiment.

FIG. 2 is a timing diagram illustrating signals applied to a pixel of a display device according to an embodiment.

Referring to FIG. 2, the previous low-level scan signal Sn−1 may be supplied through the previous scan line 152 for an initialization period. The initialization transistor T4 may be turned on according to the low-level previous scan signal Sn−1. Then, the initialization voltage Vint may be applied from the initialization voltage line 171 to the gate electrode G1 of the driving transistor T1 through the initialization transistor T4, and the driving transistor T1 may be initialized by the initialization voltage Vint.

Then, the low-level scan signal Sn may be supplied through the scan line 151 for a data programming period. The switching transistor T2 and the compensation transistor T3 may be turned on according to the low-level scan signal Sn. In this case, the driving transistor T1 may be diode-connected by the turned-on compensation transistor T3, and may be biased forward.

Then, a compensation voltage Dm+Vth (Vth is a negative value), which is the data signal Dm supplied from the data line 191 and a threshold voltage (Vth) of the driving transistor T1, may be applied to the gate electrode G1 of the driving transistor T1. That is, the gate voltage Vg applied to the gate electrode G1 of the driving transistor T1 may be the compensation voltage Dm+Vth.

The compensation voltage Dm+Vth and the driving voltage ELVDD may be applied to respective ends Cst1 and Cst2 of the storage capacitor Cst. A charge corresponding to a voltage difference between both ends Cst1 and Cst2 may be stored in the storage capacitor Cst.

Then, the light emission control signal EM supplied from the light emission control line 153 may be changed from a high level to a low level for a light emission period. Then, the operation control transistor T5 and the light emission control transistor T6 may be turned on by the low-level light emission control signal EM for the light emission period.

Then, a driving current Id corresponding to a voltage difference between the gate voltage Vg of the gate electrode G1 of the driving transistor T1 and the driving voltage ELVDD may be generated, and the driving current Id may be supplied to the organic light emitting diode OLED through the light emission control transistor T6. A driving gate-source voltage Vgs of the driving transistor T1 may be maintained at "(Dm+Vth)−ELVDD" by the storage capacitor Cst for the light emission period. According to a current-voltage relationship of the driving transistor T1, the driving current Id may be proportional to a square "$(Dm-ELVDD)^2$" of a value obtained by subtracting the threshold voltage Vth from the driving gate-source voltage Vgs. Therefore, the driving current Id may be determined regardless of the threshold voltage Vth of the driving transistor T1.

In this case, the bypass transistor T7 may receive a bypass signal BP from the bypass control line 156, and may be turned on. Accordingly, the driving current Id may be partially discharged through the bypass transistor T7 as a bypass current Ibp.

When the display device displays a black image, if the organic light emitting diode OLED emits light even though a minimum current of the driving transistor T1 flows as a driving current Id, the black image may not properly displayed. Therefore, the bypass transistor T7 may disperse some of the minimum current of the driving transistor T1 to one or more current paths other than a current path to the organic light emitting diode OLED as the bypass current Ibp. Here, the minimum current of the driving transistor T1 means a current for which the driving gate-source voltage Vgs of the driving transistor T1 is less than the threshold voltage Vth, and thus the driving transistor T1 may be turned off. The minimum driving current (e.g., a current which is equal to or less than about 10 pA) for which the driving transistor T1 is turned off may be transmitted to the organic light emitting diode OLED, and may be represented by an image of black luminance.

When the minimum driving current representing the black image flows, the effect of the bypass transfer of the bypass current Ibp may be significant. However, when a large driving current representing an image like a general image or a white image flows, an effect of the bypass current Ibp may be minimal. Therefore, when the driving current representing the black image flows, a light emitting current Ioled of the organic light emitting diode OLED, which is reduced from the driving current Id by as much as the bypass current Ibp exiting through the bypass transistor T7, may have a minimum current amount that is at a level sufficient to represent the black image. Therefore, an accurate black luminance image may be achieved by using the bypass transistor T7 to improve contrast ratio. In FIG. 2, the bypass signal BP is the same as, or occurs at a same time as, the previous scan signal Sn−1, however, is not necessarily limited thereto.

Hereinafter, a detailed structure of the display device according to an embodiment will be described in detail with reference to FIGS. 3 and 4.

Figure 3:
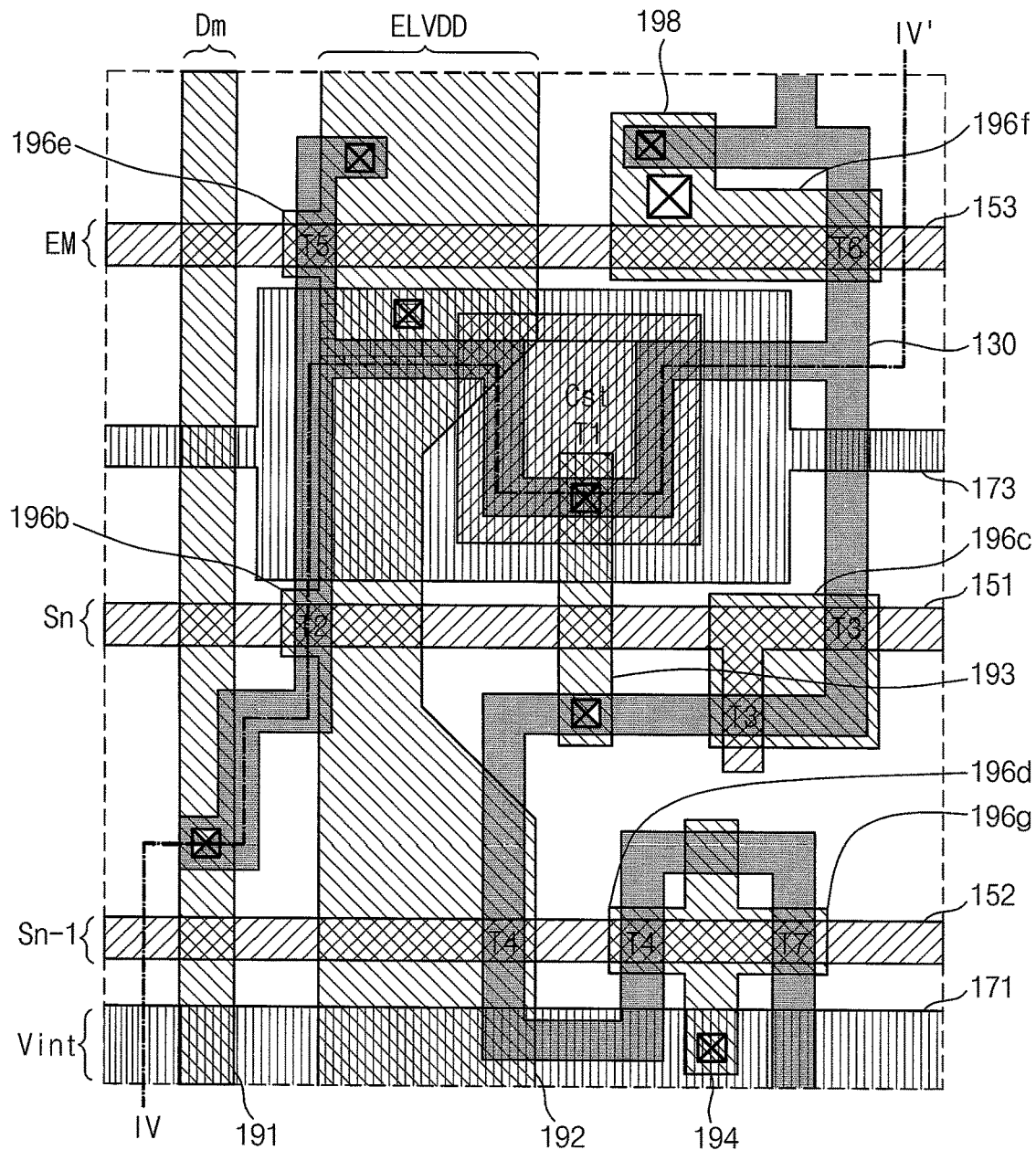
FIG. 3 is a plan view illustrating a pixel of a display device according to an embodiment.

FIG. 3 is a plan view illustrating a pixel of a display device according to an embodiment. FIG. 4 is a cross-sectional view illustrating the display device in FIG. 3 taken along the line IV-IV'.

Hereinafter, a detailed planar structure of the display device according to an embodiment will be described in detail with reference to FIG. 3, and a detailed cross-sectional structure will be described in detail with reference to FIG. 4.

Referring to FIG. 3, a display device according to an embodiment may include an active pattern 130, a first conductive layer 151, 152, and 153, a second conductive layer 171 and 173, and a third conductive layer 191 and 192. Insulation layers (not illustrated) may be interposed between the active pattern 130, the first conductive layer 151, 152, and 153, the second conductive layer 171 and 173, and the third conductive layer 191 and 192. The display device may further include a pixel electrode layer, a light emitting layer, and a common electrode layer.

The active pattern 130 may include a driving active pattern of the driving transistor T1, a switching active pattern of the switching transistor T2, a compensation active pattern of the compensation transistor T3, an initialization active pattern of the initialization transistor T4, an operation control active pattern of the operation control transistor T5, a light emission control active pattern of the light emission control transistor T6, and a bypass active pattern of the bypass transistor T7. In an embodiment, as illustrated in FIG. 3, the active pattern 130 may be formed as one connected pattern in one pixel. However, in another embodiment, the active pattern 130 may be formed as two or more separated patterns. The active pattern 130 may have various shapes, and may have bent portions as illustrated in FIG. 3.

The first conductive layer 151, 152, and 153 may include the scan line 151, the previous scan line 152, and the light emission control line 153, which may apply the scan signal Sn, the previous scan signal Sn−1, and the light emission control signal EM, respectively. The scan line 151, the previous scan line 152, and the light emission control line 153 may extend along a row direction. In an embodiment, the bypass control line 156 may be the same as the previous scan line 152, and the bypass control signal BP may be the same as the previous scan signal Sn−1.

The second conductive layer 171 and 173 may include the initialization voltage line 171, which may apply the initialization voltage Vint, and a storage line 173. The initialization voltage line 171 and the storage line 173 may be parallel to the scan line 151, the previous scan line 152, and the light emission control line 153.

The third conductive layer 191 and 192 may include the data line 191 and the driving voltage line 192, which apply the data signal Dm and the driving voltage ELVDD, respectively. The data line 191 and the driving voltage line 192 may cross the scan line 151, the previous scan line 152, and the light emission control line 153.

The display device according to an embodiment may include the driving transistor T1, the switching transistor T2, the compensation transistor T3, the initialization transistor T4, the operation control transistor T5, the light emission control transistor T6, the bypass transistor T7, the storage capacitor Cst, and the organic light emitting diode OLED. Here, the compensation transistor T3 and the initialization transistor T4 may have a dual gate structure so as to block or reduce a leakage current.

The driving transistor T1, the switching transistor T2, the compensation transistor T3, the initialization transistor T4, the operation control transistor T5, the light emission control transistor T6, and the bypass transistor T7 may be located along the active pattern 130. The active pattern 130 may include a channel region, which is doped with N-type impurities or P-type impurities, and a source region and a drain region, which are formed at opposing sides of the channel region and have a higher doping concentration than that of the doping impurities doped in the channel region.

The driving transistor T1 may include the driving active pattern, and a driving gate electrode located to be insulated therefrom. The driving active pattern, which is a portion of the active pattern 130, may include a driving channel region, a driving source region, and a driving drain region. The driving channel region may be curved (or non-linear), and may have a meandering shape or a zigzag shape. As such, by forming the curved driving channel region, the driving channel region may be formed to extend in a narrow space. Accordingly, a driving range of the driving gate-source voltage Vgs between the driving gate electrode and the driving source region may be increased by the extended driving channel region. Because the driving range of the driving gate-source voltage Vgs is increased, a grayscale of light emitted from the organic light emitting diode OLED may be finely controlled by changing the magnitude of the driving gate-source voltage Vgs, and as a result, the resolution of the display device may be enhanced, and display quality may be improved.

The driving gate electrode may overlap the driving channel region, and the driving source region and the driving drain region may be formed to be adjacent to opposing sides of the driving channel region. The driving gate electrode may be connected to a driving connecting member 193 through a contact hole. The driving gate electrode may correspond to the first conductive layer.

The switching transistor T2 may include the switching active pattern and a switching gate electrode located to be insulated therefrom. The switching active pattern, which is a portion of the active pattern 130, may include a switching channel region, a switching source region, and a switching drain region. The switching gate electrode, which is a portion of the scan line 151, may overlap the switching channel region, and the switching source region and the switching drain region may be formed to be adjacent to opposing sides of the switching channel region. The switching source region may be connected to the data line 191 through a contact hole.

The compensation transistor T3 may include the compensation active pattern and a compensation gate electrode located to be insulated therefrom. The compensation active pattern, which is a portion of the active pattern 130, may include a compensation channel region, a compensation source region, and a compensation drain region. The compensation gate electrode, which is a portion of the scan line 151, may be formed as two so as to reduce or prevent the current leakage, and may overlap the compensation channel region. The compensation source region and the compensation drain region may be formed to be adjacent to opposing sides of the compensation channel region. The compensation drain region may be connected to the driving connecting member 193 through a contact hole.

The initialization transistor T4 may include the initialization active pattern and an initialization gate electrode located to be insulated therefrom. The initialization active pattern, which is a portion of the active pattern 130, may include an initialization channel region, an initialization source region, and an initialization drain region. The initialization gate electrode, which is a portion of the previous scan line 152, may be formed as a pair so as to reduce or prevent the current leakage, and may overlap the initialization channel region. The initialization source region and the initialization drain region may be formed to be adjacent to opposing sides of the initialization channel region. The initialization source region may be connected to an initialization connecting member 194 through a contact hole.

The operation control transistor T5 may include the operation control active pattern and an operation control gate electrode located to be insulated therefrom. The operation control active pattern, which is a portion of the active pattern 130, may include an operation control channel region, an operation control source region, and an operation control drain region. The operation control gate electrode, which is a portion of the light emission control line 153, may overlap the operation control channel region, and the operation control source region and the operation control drain region may be formed to be adjacent to opposing sides of the operation control channel region. The operation control source region may be connected to a portion of the driving voltage line 192 through a contact hole.

The light emission control transistor T6 may include the light emission control active pattern and a light emission control gate electrode located to be insulated therefrom. The light emission control active pattern, which is a portion of the active pattern 130, may include a light emission control channel region, a light emission control source region, and a light emission control drain region. The light emission control gate electrode, which is a portion of the light emission control line 153, may overlap the light emission control channel region, and the light emission control source region and the light emission control drain region may be formed to be adjacent to opposing sides of the light emission control channel region. The light emission control drain region may be connected to a pixel connecting member 198 through a contact hole.

The bypass transistor T7 may include the bypass active pattern and a bypass gate electrode located to be insulated therefrom. The bypass active pattern, which is a portion of the active pattern 130, may include a bypass channel region, a bypass source region, and a bypass drain region. The bypass gate electrode, which is a portion of the previous scan line 152, may overlap the bypass channel region, and the bypass source region and the bypass drain region may be formed to be adjacent to opposing sides of the bypass channel region.

The storage capacitor Cst may include a first storage electrode and a second storage electrode, which are insulated from each other. The first storage electrode may correspond to the driving gate electrode. The second storage electrode may be a portion extending from the storage line 173. The second storage electrode may occupy a wider area than that of the driving gate electrode, and may entirely cover the driving gate electrode.

Here, storage capacitance may be determined by a charge stored in the storage capacitor Cst and a voltage between the both storage electrodes. As such, the driving gate electrode may be used as the first storage electrode, and thus a space in which the storage capacitor may be formed may be secured or accomplished in a space that is narrowed or limited due to the driving channel region occupying a large area within the pixel.

The initialization connecting member 194 may be connected to the initialization voltage line 171 through a contact hole, and the pixel connecting member 198 may be connected to the pixel electrode through a contact hole. The driving connecting member 193, the initialization connecting member 194, and the pixel connecting member 198 may correspond to the third conductive layer.

The display device according to an embodiment may include a first protection member 196. The first protection member 196 may include a first switching protection member 196b, a first compensation protection member 196c, a first initialization protection member 196d, a first operation control protection member 196e, a first light emission control protection member 196f, and a first bypass protection member 196g. The first protection member 196 may cover the switching transistor T2, the compensation transistor T3, the initialization transistor T4, the operation control transistor T5, the light emission control transistor T6, and the bypass transistor T7. Accordingly, although impact may be applied from the outside to upper portions of the display device, the first protection member 196 may protect the transistors, and stress applied to the transistors may be reduced.

The first switching protection member 196b, the first compensation protection member 196c, the first initialization protection member 196d, the first operation control protection member 196e, the first light emission control protection member 196f, and the first bypass protection member 196g may overlap the switching transistor T2, the compensation transistor T3, the initialization transistor T4, the operation control transistor T5, the light emission control transistor T6, and the bypass transistor T7, respectively, in a plan view. Specifically, the first switching protection member 196b, the first compensation protection member 196c, the first initialization protection member 196d, the first operation control protection member 196e, the first light emission control protection member 196f, and the first bypass protection member 196g may correspond to the switching channel region, the compensation channel region, the initialization channel region, the operation control channel region, the light emission control channel region, and the bypass channel region, respectively, in a plan view. The first protection member 196 may have a higher elastic modulus than that of nearby regions, and thus, a bending stiffness of a region in which the transistors are located may be greater than that of a region in which the transistors are not located. In this case, although the display device may be deformed (e.g., bent), stress applied to the display device may be concentrated at the region in which the transistors are not located. Therefore, stress applied to the transistors may be reduced.

The first protection member 196 may protrude from at least one of the data line 191, the driving voltage line 192, the driving connecting member 193, the initialization connecting member 194, and the pixel connecting member 198, which correspond to the third conductive layer. In an embodiment, the first switching protection member 196b and the first operation control protection member 196e may protrude from the driving voltage line 192, the first initialization protection member 196d and the first bypass protection member 196g may protrude from the initialization connecting member 194, and the first light emission control protection member 196f may protrude from the pixel connecting member 198. Therefore, the first switching protection member 196b, the first compensation protection member 196c, the first initialization protection member 196d, the first operation control protection member 196e, the first light emission control protection member 196f, and the first bypass protection member 196g may correspond to the third conductive layer.

In the present embodiment, the first protection member 196 may not cover the driving transistor T1 among the transistors. However, the second storage electrode of the storage capacitor Cst may cover the driving transistor T1, thus, the second storage electrode may protect the driving transistor T1 even when impact is applied from the outside to upper portions of the display device.

Hereinafter, the cross-sectional structures of the display device according to an embodiment will be described in detail according to a stacking order with reference to FIG. 4. In this case, because the stacked structures of the compensation transistor T3, the initialization transistor T4, the operation control transistor T5, the light emission control transistor T6, and the bypass transistor T7 are substantially the same as that of the switching transistor T2, a detailed description thereof will be omitted.

Figure 4:
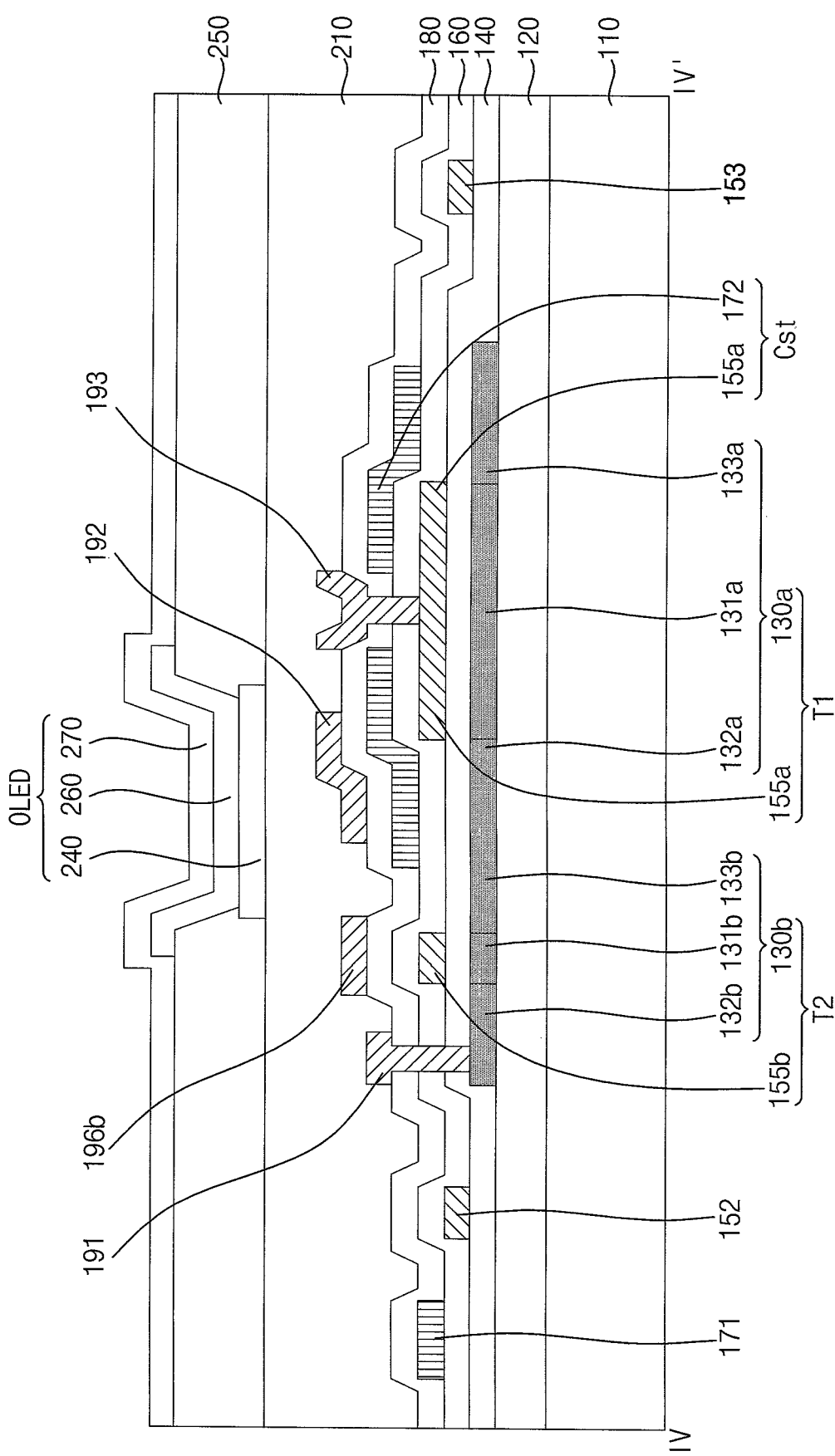
FIG. 4 is a cross-sectional view illustrating the display device in FIG. 3 taken along the line IV-IV'.

Referring to FIG. 4, a buffer layer 120 may be formed on a substrate 110. The substrate 110 may be formed of insulating material such as glass, crystal, ceramic, or plastic. The buffer layer 120 may block impurities from the substrate 110 during a crystallization process for forming polysilicon so as to improve characteristics of the polysilicon, and may reduce stress applied to the substrate 110.

The active pattern 130, including the driving active pattern 130a and the switching active pattern 130b, may be formed on the buffer layer 120. The driving active pattern 130a may include a driving channel region 131a, and may include a driving source region 132a and a driving drain region 133a, which are formed at opposing sides of the driving channel region 131a. The switching active pattern 130b may include a switching channel region 131b, and may include a switching source region 132b and a switching drain region 133b, which are formed at opposing sides of the switching channel region 131b. The active pattern 130 may be formed of amorphous silicon, polycrystalline silicon, oxide semiconductor, or the like.

A first gate insulation layer 140 covering the active pattern 130 may be located thereon. The first conductive layer 151, 152, 153, 155a, and 155b, which includes the scan line 151, the switching gate electrode 155b, the previous scan line 152, the light emission control line 153, and the driving gate electrode (a first storage electrode) 155a, may be on the first gate insulation layer 140. The driving gate electrode 155a and the switching gate electrode 155b may overlap the driving channel region 131a and the switching channel region 131b, respectively.

A second gate insulation layer 160 covering the first conductive layer 151, 152, 153, 155a, and 155b may be located thereon. The first gate insulation layer 140 and the second gate insulation layer 160 may be formed of inorganic insulating material such as silicon nitride (SiNx), silicon oxide (SiOx), or silicon oxynitride (SiOxNy).

The second conductive layer 171, 172, and 173, including the initialization voltage line 171 and the storage line 173, which includes the second storage electrode 172, may be on the second gate insulation layer 160. The second storage electrode 172 may occupy a larger area than that of the first storage electrode 155a, which functions as the driving gate electrode. Thus, the second storage electrode 172 may entirely cover the driving gate electrode 155a in a plan view. The first conductive layer 151, 152, 153, 155a, and 155b and the second conductive layer 171, 172, and 173 may be formed of metal such as copper (Cu), aluminum (Al), or molybdenum (Mo).

An insulation interlayer 180 covering the second conductive layer 171, 172, and 173 may be located thereon. The insulation interlayer 180 may be formed of inorganic insulating material such as silicon nitride (SiNx), silicon oxide (SiOx), or silicon oxynitride (SiOxNy).

Contact holes may be formed in the insulation interlayer 180. The third conductive layer 191, 192, 193, and 196 including the data line 191, the driving voltage line 192, the driving connecting member 193, and the first protection member 196, may be on the insulation interlayer 180. The third conductive layer 191, 192, 193, and 196 may be formed of metal such as copper (Cu), aluminum (Al), or molybdenum (Mo).

The data line 191 may be connected to the switching source region 132b through a contact hole passing through the first gate insulation layer 140, the second gate insulation layer 160, and the insulation interlayer 180. The driving connecting member 193 may be connected to the first storage electrode 155a through a contact hole passing through the second gate insulation layer 160 and the insulation interlayer 180.

The first protection member 196 may be formed on substantially the same level as the data line 191 and the driving voltage line 192, and may overlap the transistors in a plan view. For example, the first switching protection member 196b protruded from the driving voltage line 192 may overlap the switching transistor T2 in a plan view. In an embodiment, the first switching protection member 196b may be on the switching channel region 131b to correspond to the switching channel region 131b in a plan view. The first switching protection member 196b may overlap and cover the switching transistor T2, and thus may protect the switching transistor T2 from impact applied to upper portions of the display device from the outside (e.g., externally applied impact).

A first planarization layer 210 covering the third conductive layer 191, 192, 193, and 196 may be located thereon. The first planarization layer 210 may cover the third conductive layer 191, 192, 193, and 196 to be flattened/planarized, so that a pixel electrode 240 on the first planarization layer 210 may be formed without a stepped region. The first planarization layer 210 may be formed of organic insulating material such as polyacrylate resin or polyimide resin.

An elastic modulus of the first protection member 196 may be greater than an elastic modulus of the first planarization layer 210. For example, the elastic modulus of the first protection member 196 may be about 50 gigapascals (GPa) or more (e.g., greater than about 70 GPa). The first planarization layer 210 may be located near to the first protection member 196 and at substantially the same planar level as the first protection member 196, and a bending stiffness of a region in which the first protection member 196 is located may be greater than a bending stiffness of a region in which the first protection member 196 is not located. Because the first protection member 196 overlaps the transistors in a plan view as described above, a bending stiffness of a region in which the transistors are located may be greater than a bending stiffness of a region in which the transistors are not located. Therefore, although the display device may be deformed (e.g., bent), stress applied to the display device may be concentrated at the region in which the transistors are not located, and thus, stress applied to the transistors may be reduced.

The pixel electrode 240 may be on the first planarization layer 210. A pixel defining layer 250 covering the first planarization layer 210 and an edge(s) of the pixel electrode 240 may be located thereon. The pixel defining layer 250 may have a pixel opening portion exposing the pixel electrode 240. The pixel defining layer 250 may be formed of organic insulating material such as polyacrylate resin or polyimide resin; or silica related inorganic insulating material.

An organic light emitting layer 260 may be on the pixel electrode 240 exposed by the pixel opening portion, and a common electrode 270 may be on the organic light emitting layer 260. The common electrode 270 may also be on the pixel defining layer 250, and may be formed over a plurality of pixels. Accordingly, an organic light emitting diode OLED, including the pixel electrode 240, the organic light emitting layer 260, and the common electrode 270, may be formed.

Here, the pixel electrode 240 may be an anode that is a hole injection electrode, and the common electrode 270 may be a cathode that is an electron injection electrode. However, the present disclosure is not necessarily limited thereto, and the pixel electrode 240 may be the cathode, and the common electrode 270 may be the anode, depending on a driving method of an embodiment. When holes and electrons are injected into the organic light emitting layer 260 from the pixel electrode 240 and the common electrode 270, respectively, and when excitons, which are formed by combinations of the injected holes and electrons, fall from an excitation state to a ground state, light may be emitted.

The organic light emitting layer 260 may be formed of low-molecular organic material or high-molecular organic material, such as poly(3,4-ethylenedioxythiophene) (PEDOT). The organic light emitting layer 260 may be formed with multiple layers including at least one of a light emission layer, a hole injection layer (HIL), a hole transport layer (HTL), an electron transport layer (ETL), and an electron injection layer (EIL). When the organic light emitting layer 260 includes all of the layers, the hole injection layer may be on the pixel electrode 240, which is a positive electrode, and the hole transport layer, the light emission layer, the electron transport layer, and the electron injection layer may be sequentially laminated thereon.

An encapsulation member protecting the organic light emitting diode OLED may be formed on the common electrode 270. The encapsulation member may be sealed to the substrate 110 by a sealant. The encapsulation member may be formed of various materials, such as glass, quartz, ceramic, plastic, or metal. A thin film encapsulation layer may be formed on the common electrode 270 by depositing at least one inorganic layer and at least one organic layer without the usage of the sealant.

Meanwhile, according to the above embodiment, the display device may include only the first protection member. However, in another embodiment, the display device may further include a second protection member.

Hereinafter, a detailed structure of a display device according to an embodiment will be described in detail with reference to FIGS. 5 and 6.

Figure 5:
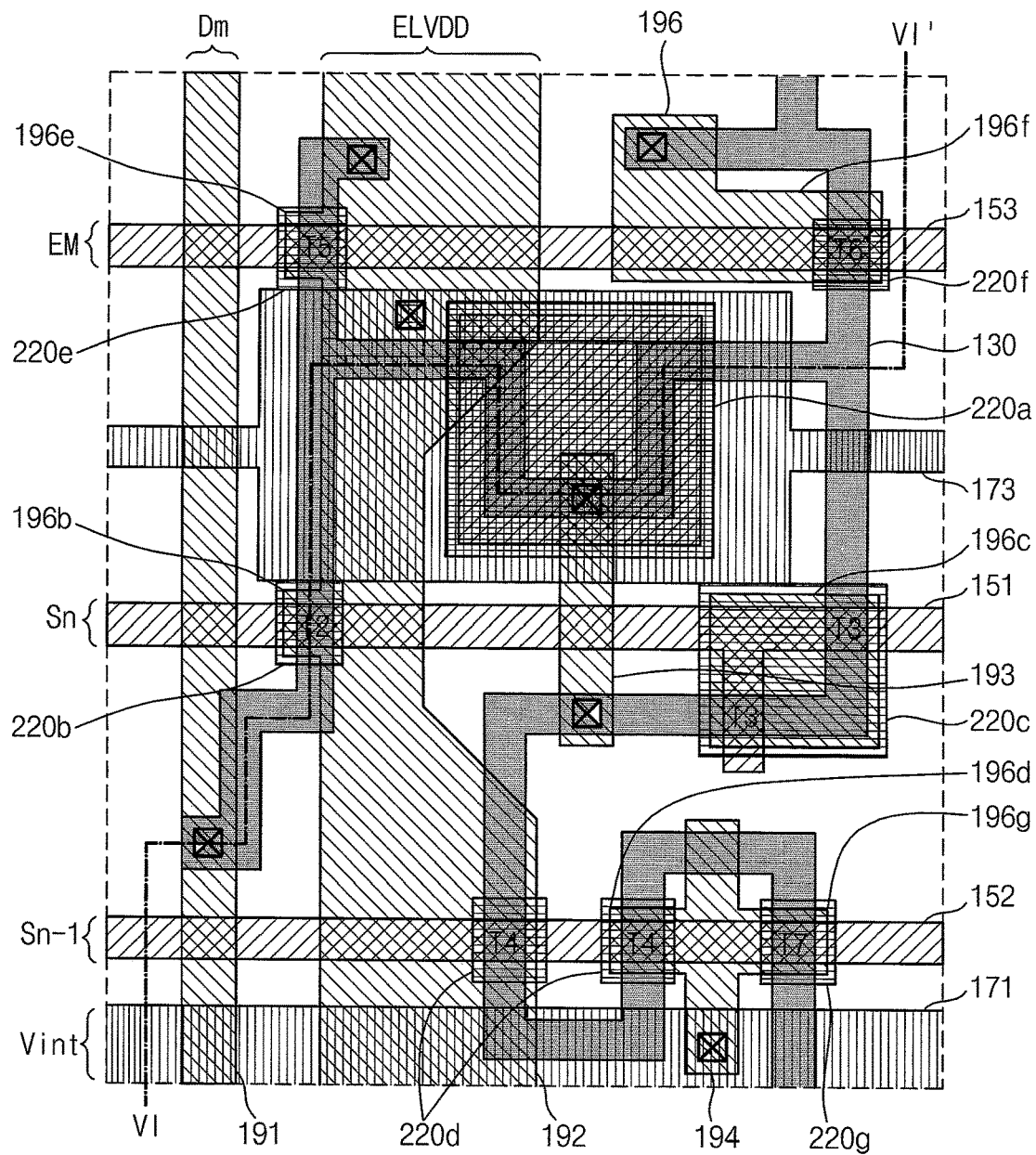
FIG. 5 is a plan view illustrating a pixel of a display device according to an embodiment.

FIG. 5 is a plan view illustrating a pixel of a display device according to an embodiment. FIG. 6 is a cross-sectional view illustrating the display device in FIG. 5 taken along the line VI-VI'.

Figure 6:
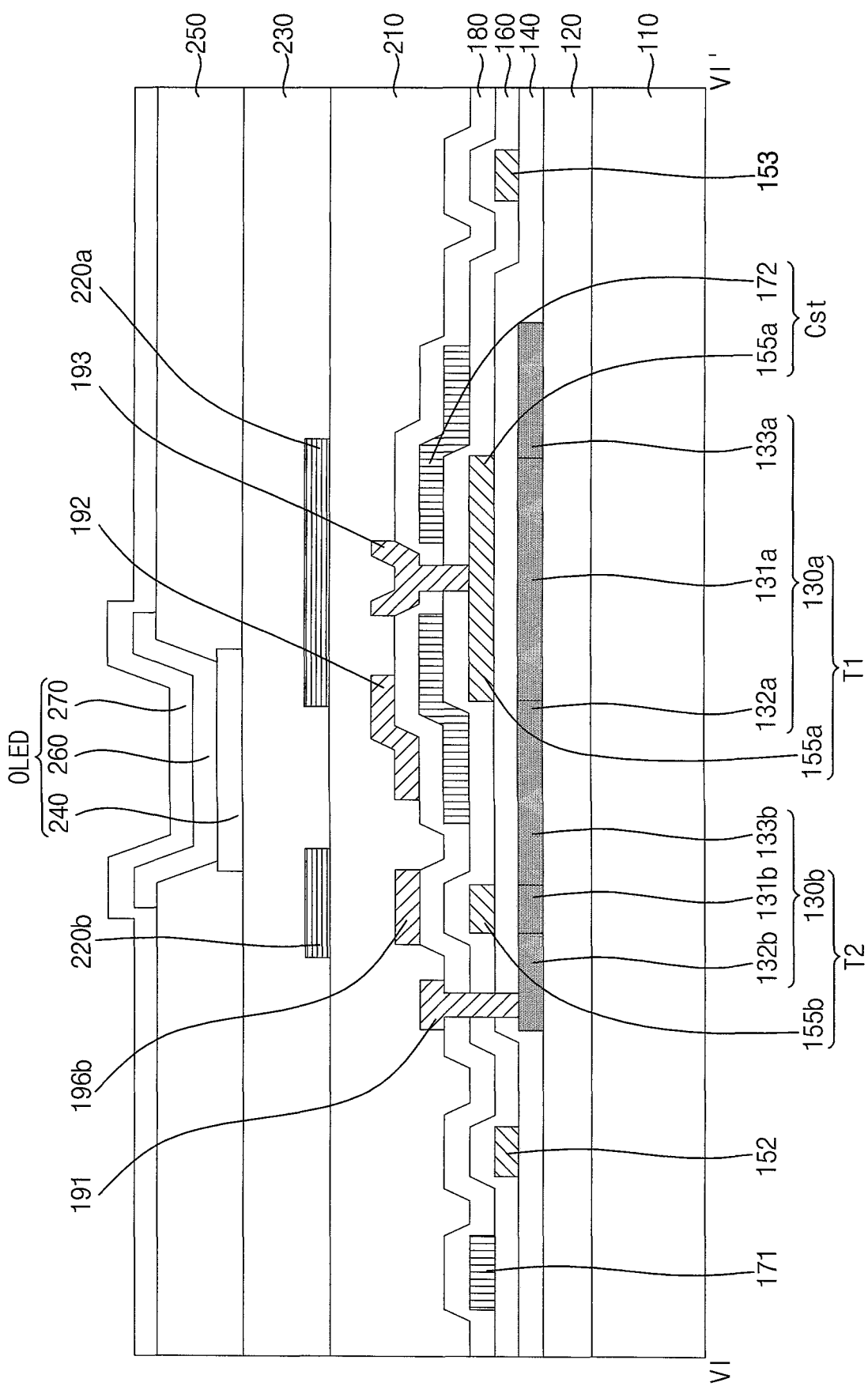
FIG. 6 is a cross-sectional view illustrating the display device in FIG. 5 taken along the line VI-VI'.

A display device according to an embodiment illustrated in FIGS. 5 and 6 may be substantially the same as or similar to the display device according to an embodiment illustrated in FIGS. 3 and 4 except for the inclusion of a second protection member, such that repeated explanations may be omitted.

Referring to FIG. 5, a display device according to an embodiment may include a second protection member 220. The second protection member 220 may include a second driving protection member 220a, a second switching protection member 220b, a second compensation protection member 220c, a second initialization protection member 220d, a second operation control protection member 220e, a second light emission control protection member 220f, and a second bypass protection member 220g. The second protection member 220 may cover the driving transistor T1, the switching transistor T2, the compensation transistor T3, the initialization transistor T4, the operation control transistor T5, the light emission control transistor T6, and the bypass transistor T7. Accordingly, although impact is applied from the outside to upper portions of the display device, the second protection member 220 may protect the transistors, and stress applied to the transistors may be reduced.

The second driving protection member 220a, the second switching protection member 220b, the second compensation protection member 220c, the second initialization protection member 220d, the second operation control protection member 220e, the second light emission control protection member 220f, and the second bypass protection member 220g may overlap the driving transistor T1, the switching transistor T2, the compensation transistor T3, the initialization transistor T4, the operation control transistor T5, the light emission control transistor T6, and the bypass transistor T7, respectively, in a plan view. Specifically, the second driving protection member 220a, the second switching protection member 220b, the second compensation protection member 220c, the second initialization protection member 220d, the second operation control protection member 220*e*, the second light emission control protection member 220*f*, and the second bypass protection member 220*g* may correspond to the driving channel region, the switching channel region, the compensation channel region, the initialization channel region, the operation control channel region, the light emission control channel region, and the bypass channel region, respectively, in a plan view. The second protection member 220 may have a higher elastic modulus than that of nearby regions, and thus, a bending stiffness of a region in which the transistors are located may be greater than that of a region in which the transistors are not located. In this case, although the display device may be deformed (e.g., bent), stress applied to the display device may be concentrated at the region in which the transistors are not located. Therefore, stress applied to the transistors may be reduced.

Referring to FIG. 6, the second protection member 220 and a second planarization layer 230 may be between the first planarization layer 210 and the pixel defining layer 250.

The second protection member 220 may be on the first planarization layer 210. The second protection member 220 may overlap the transistors in a plan view. Specifically, the second driving protection member 220*a* may overlap the driving transistor T1 in a plan view, and the second switching protection member 220*b* may overlap the switching transistor T2 in a plan view. In an embodiment, the second driving protection member 220*a* may be on the driving channel region 131*a* to correspond to the driving channel region 131*a* in a plan view, and the second switching protection member 220*b* may be on the switching channel region 131*b* to correspond to the switching channel region 131*b* in a plan view. The second driving protection member 220*a* may overlap and cover the driving transistor T1, and the second switching protection member 220*b* may overlap and cover the switching transistor T2. Thus, the second driving protection member 220*a* and the second switching protection member 220*b* may protect the driving transistor T1 and the switching transistor T2, respectively, from impact applied to upper portions of the display device from the outside.

The second protection member 220 may be formed of metal such as copper (Cu), aluminum (Al), or molybdenum (Mo); or inorganic insulating material such as silicon nitride (SiNx), silicon oxide (SiOx), or silicon oxynitride (SiOxNy).

The second planarization layer 230 covering the second protection member 220 may be located thereon. The second planarization layer 230 may cover the second protection member 220 to be flattened, so that a pixel electrode 240 on the second planarization layer 230 may be formed without a stepped/uneven region. The second planarization layer 230 may be formed of organic insulating material, such as polyacrylate resin or polyimide resin.

An elastic modulus of the second protection member 220 may be greater than an elastic modulus of the second planarization layer 230. For example, the elastic modulus of the second protection member 220 may be at least about 50 GPa (e.g., greater than about 70 GPa). The second planarization layer 230 may be located near to the second protection member 220 and at substantially the same planar level as the second protection member 220, and a bending stiffness of a region in which the second protection member 220 is located may be greater than a bending stiffness of a region in which the second protection member 220 is not located. Because the second protection member 220 overlaps the transistors in a plan view as described above, a bending stiffness of a region in which the transistors are located may be greater than a bending stiffness of a region in which the transistors are not located. Therefore, although the display device may be deformed (e.g., bent), stress applied to the display device may be concentrated at the region in which the transistors are not located, and thus, stress applied to the transistors may be reduced.

Meanwhile, according to the above embodiment, the second protection member is located over the transistors, however, in another embodiment, the second protection member may be located under the transistors.

Hereinafter, a detailed structure of a display device according to an embodiment will be described in detail with reference to FIGS. 7 and 8.

Figure 7:
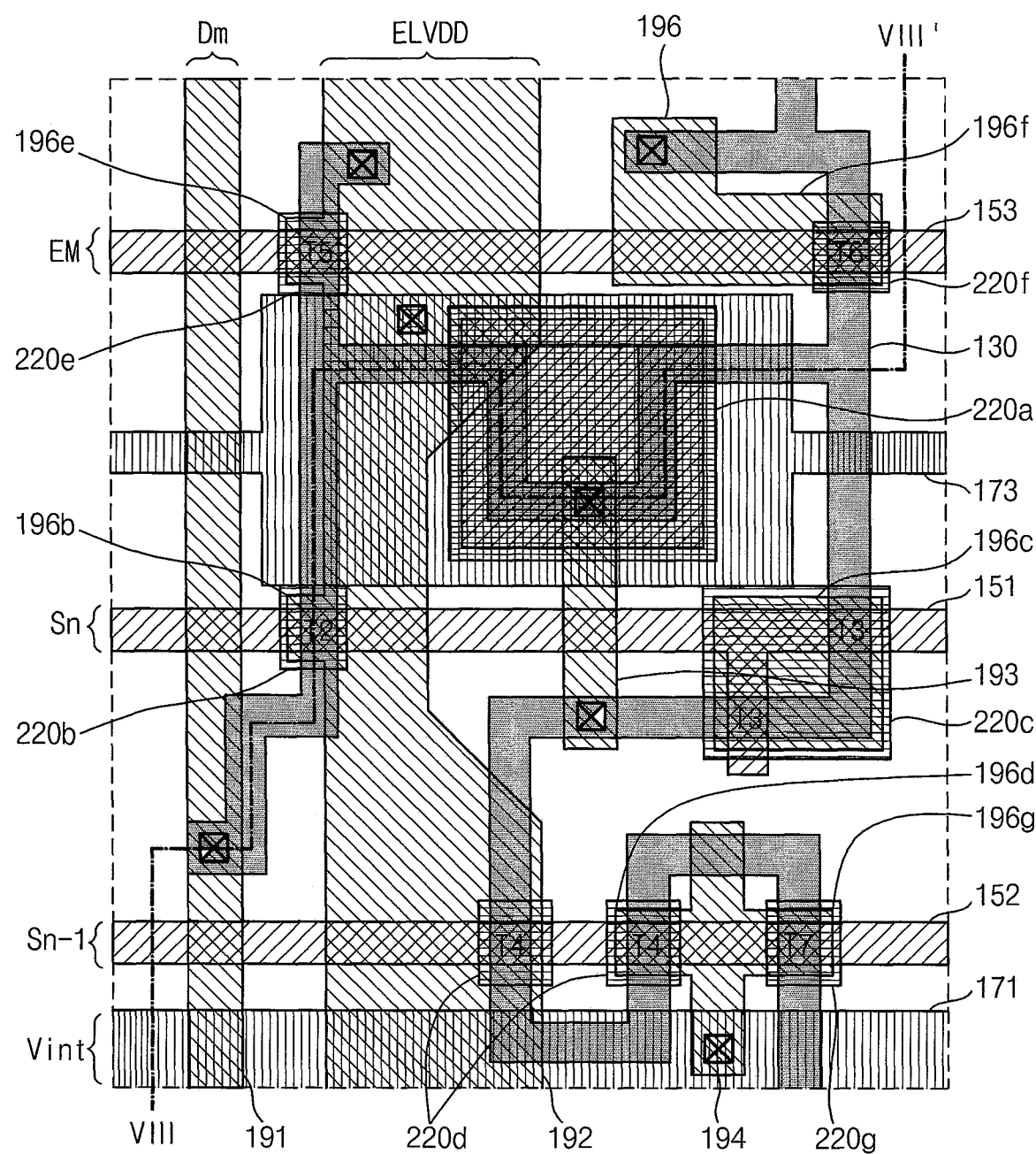
FIG. 7 is a plan view illustrating a pixel of a display device according to an embodiment.

FIG. 7 is a plan view illustrating a pixel of a display device according to an embodiment. FIG. 8 is a cross-sectional view illustrating the display device in FIG. 7 taken along the line VIII-VIII'.

Figure 8:
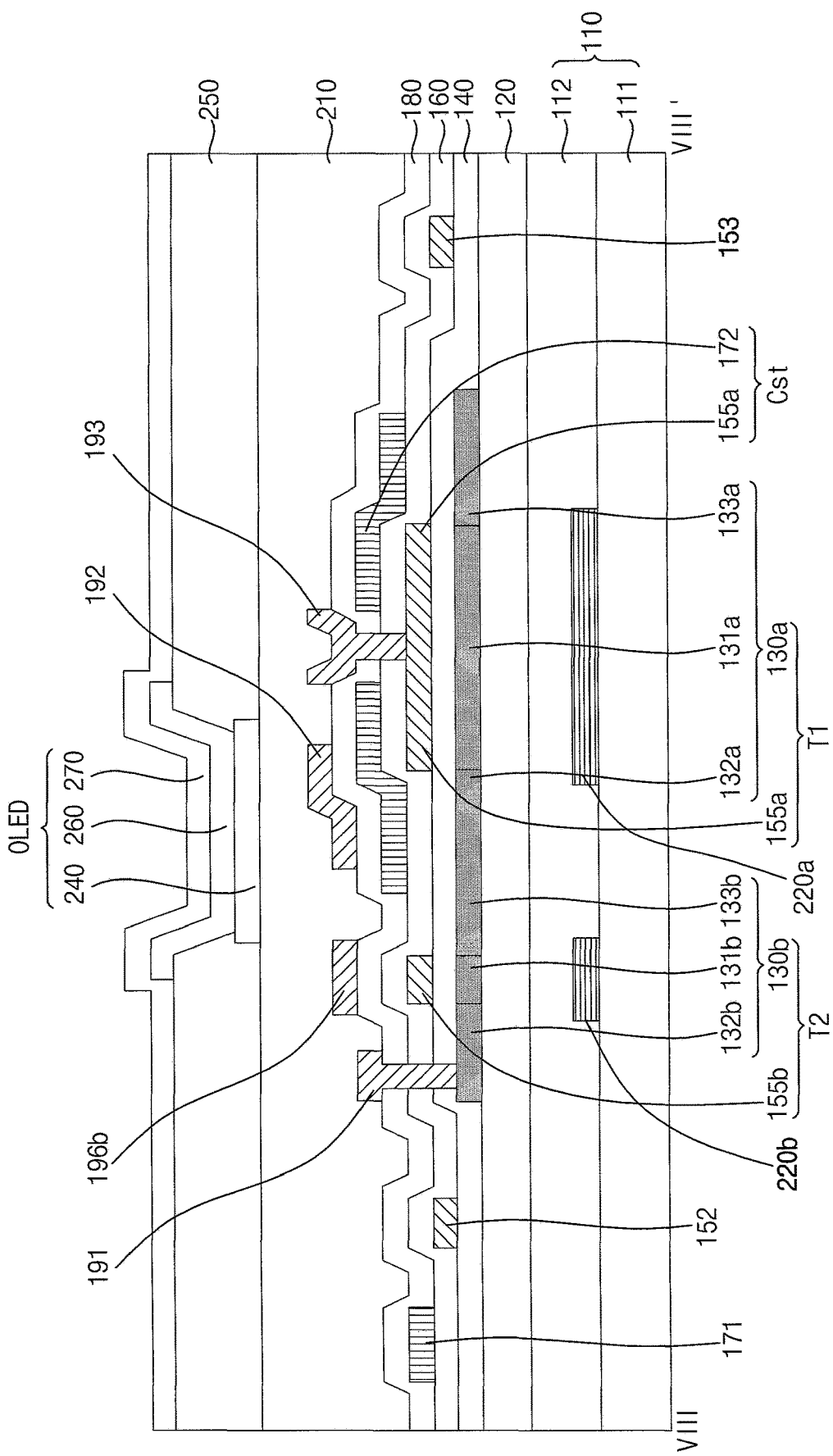
FIG. 8 is a cross-sectional view illustrating the display device in FIG. 7 taken along the line VIII-VIII'.

A display device according to an embodiment illustrated in FIGS. 7 and 8 may be substantially the same as or similar to the display device according to an embodiment illustrated in FIGS. 5 and 6 except that the second protection member is located under the transistors, such that repeated explanations may be omitted.

Referring to FIGS. 7 and 8, the substrate 110 of the display device according to an embodiment may include a first flexible layer 111 and a second flexible layer 112 on the first flexible layer 111. The first flexible layer 111 and the second flexible layer 112 may be formed of flexible material having high heat-resistance and high durability, such as polyimide, polyethylene naphthalate, polyethylene terephthalate (PET), polyarylate, polycarbonate, polyetherimide (PEI), or polyethersulfone.

The second protection member 220 may be between the first flexible layer 111 and the second flexible layer 112. The second protection member 220 may overlap the transistors in a plan view. Specifically, the second driving protection member 220*a* may overlap the driving transistor T1 in a plan view, and the second switching protection member 220*b* may overlap the switching transistor T2 in a plan view. In an embodiment, the second driving protection member 220*a* may be located under the driving channel region 131*a* to correspond to the driving channel region 131*a* in a plan view, and the second switching protection member 220*b* may be located under the switching channel region 131*b* to correspond to the switching channel region 131*b* in a plan view. The second driving protection member 220*a* may overlap the driving transistor T1, and the second switching protection member 220*b* may overlap the switching transistor T2. Thus, the second driving protection member 220*a* and the second switching protection member 220*b* may protect the driving transistor T1 and the switching transistor T2, respectively, from impact applied to lower portions of the display device from the outside.

An elastic modulus of the second protection member 220 may be greater than an elastic modulus of the second flexible layer 112. For example, the elastic modulus of the second protection member 220 may be at least about 50 GPa (e.g., greater than about 70 GPa). The second flexible layer 112 may be located near to the second protection member 220 at substantially the same planar level as the second protection member 220, and a bending stiffness of a region in which the second protection member 220 is located may be greater than a bending stiffness of a region in which the second protection member 220 is not located. Because the second protection member 220 overlaps the transistors in a plan view as described above, a bending stiffness of a region in which the transistors are located may be greater than a bending stiffness of a region in which the transistors are not located. Therefore, although the display device may be deformed (e.g., bent), stress applied to the display device may be concentrated at the region in which the transistors are not located, and thus, stress applied to the transistors may be reduced.

Meanwhile, according to the above embodiment, the second protection member is inside the substrate (between the first flexible layer and the second flexible layer), however, in another embodiment, the second protection member may be between the substrate and the transistors.

Hereinafter, a detailed structure of a display device according to an embodiment will be described in detail with reference to FIGS. 9 and 10.

Figure 9:
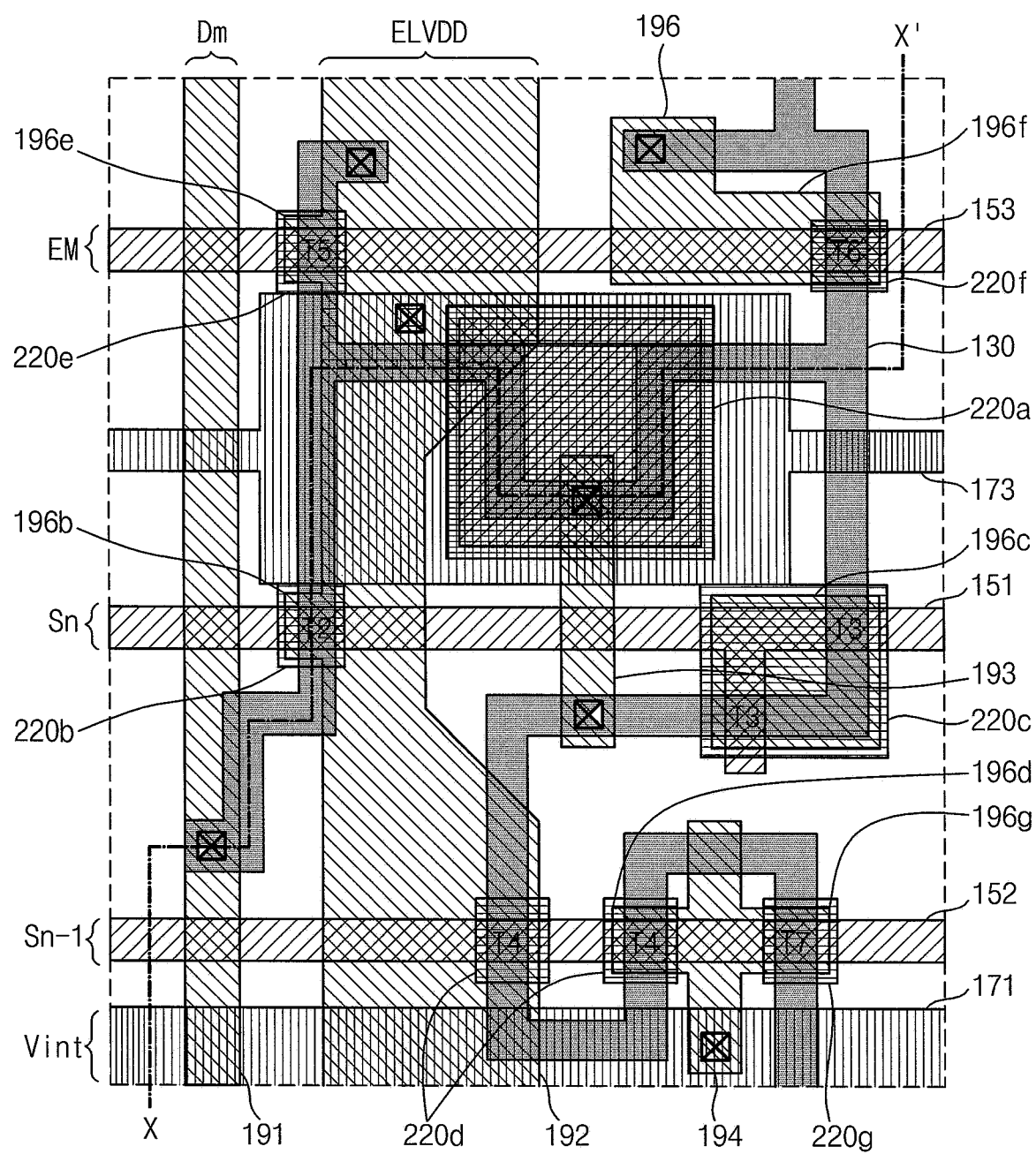
FIG. 9 is a plan view illustrating a pixel of a display device according to an embodiment.

FIG. 9 is a plan view illustrating a pixel of a display device according to an embodiment. FIG. 10 is a cross-sectional view illustrating the display device in FIG. 9 taken along the line X-X'.

Figure 10:
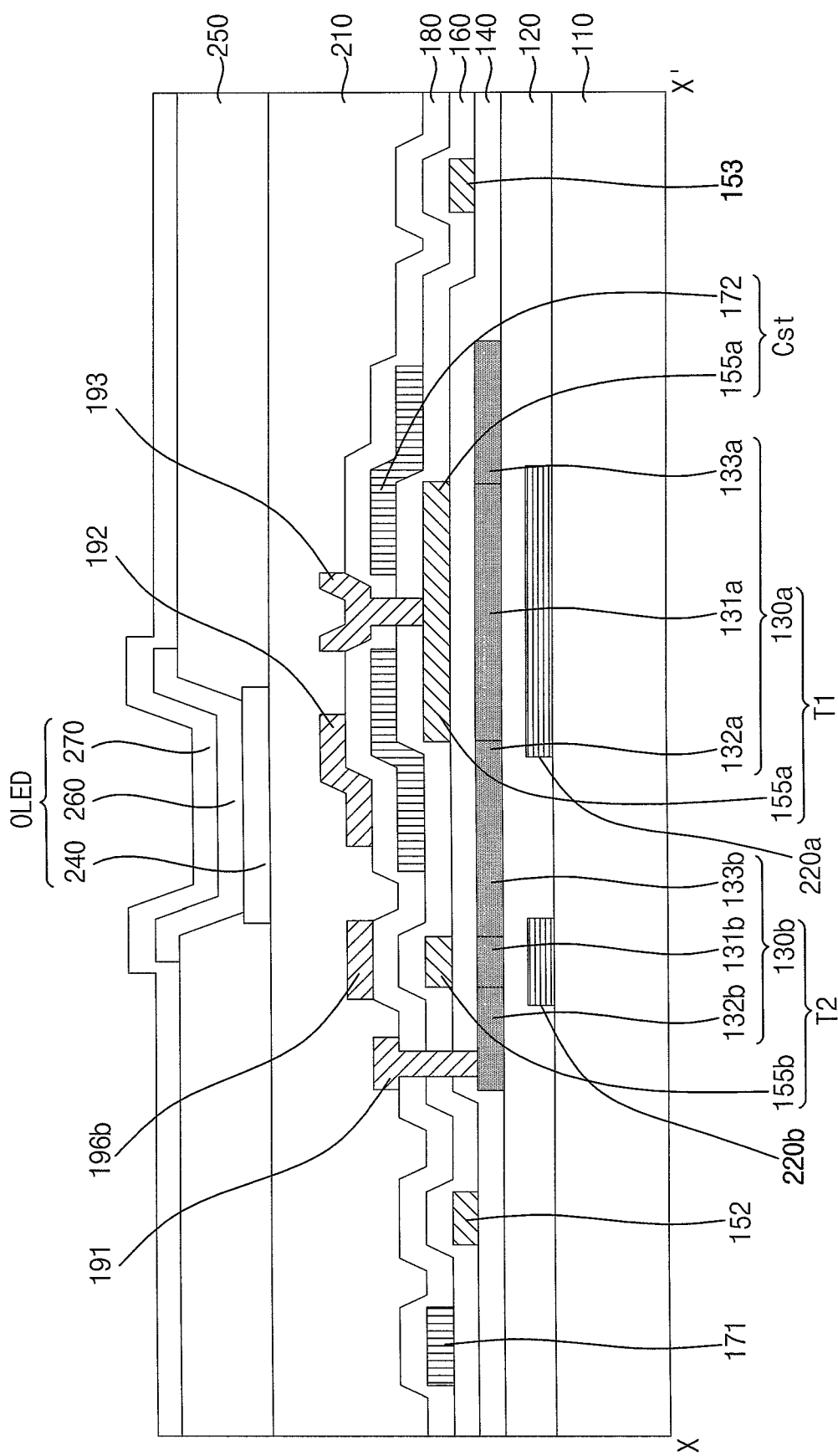
FIG. 10 is a cross-sectional view illustrating the display device in FIG. 9 taken along the line X-X'.

A display device according to an embodiment illustrated in FIGS. 9 and 10 may be substantially the same as or similar to the display device according to an embodiment illustrated in FIGS. 7 and 8 except that the second protection member is between the substrate and the transistors, such that repeated explanations may be omitted.

Referring to FIGS. 9 and 10, the second protection member 220 of the display device according to an embodiment may be between the substrate 110 and the buffer layer 120. The second protection member 220 may overlap the transistors in a plan view. Specifically, the second driving protection member 220a may overlap the driving transistor T1 in a plan view, and the second switching protection member 220b may overlap the switching transistor T2 in a plan view. In an embodiment, the second driving protection member 220a may be located under the driving channel region 131a to correspond to the driving channel region 131a in a plan view, and the second switching protection member 220b may be located under the switching channel region 131b to correspond to the switching channel region 131b in a plan view. The second driving protection member 220a may overlap the driving transistor T1, and the second switching protection member 220b may overlap the switching transistor T2. Thus, the second driving protection member 220a and the second switching protection member 220b may protect the driving transistor T1 and the switching transistor T2, respectively, from impact applied to lower portions of the display device from the outside.

An elastic modulus of the second protection member 220 may be greater than an elastic modulus of the buffer layer 120. For example, the elastic modulus of the second protection member 220 may be at least about 50 GPa (e.g., greater than about 70 GPa). The buffer layer 120 may be located near to the second protection member 220 at substantially the same planar level as the second protection member 220, and a bending stiffness of a region in which the second protection member 220 is located may be greater than a bending stiffness of a region in which the second protection member 220 is not located. Because the second protection member 220 overlaps the transistors in a plan view as described above, a bending stiffness of a region in which the transistors are located may be greater than a bending stiffness of a region in which the transistors are not located. Therefore, although the display device may be deformed (e.g., bent), stress applied to the display device may be concentrated at the region in which the transistors are not located, and thus, stress applied to the transistors may be reduced.

Hereinafter, a detailed structure of a display device according to an embodiment will be described in detail with reference to FIG. 11.

Figure 11:
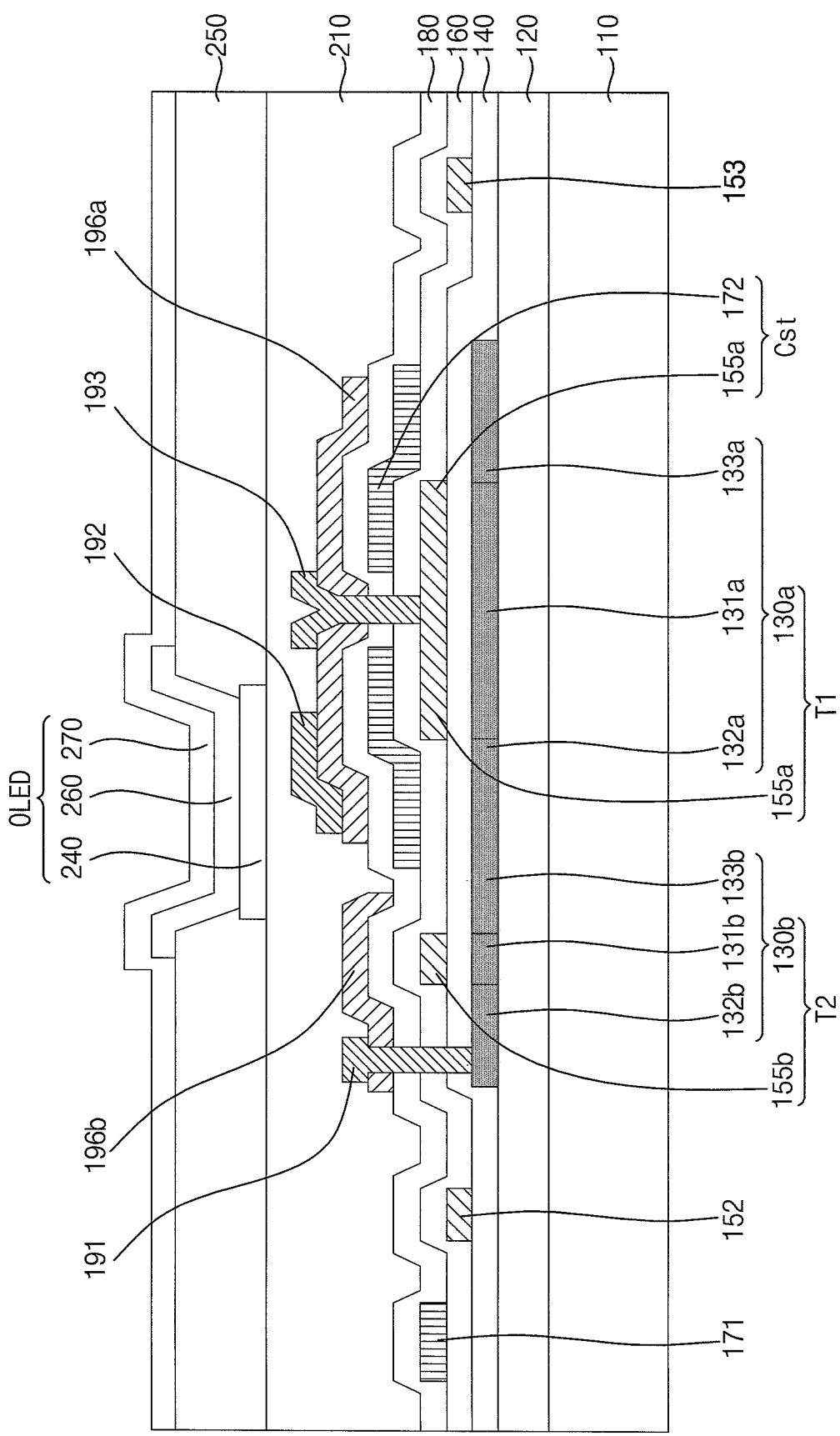
FIG. 11 is a cross-sectional view illustrating a display device according to an embodiment.

FIG. 11 is a cross-sectional view illustrating a display device according to an embodiment.

A display device according to an embodiment illustrated in FIG. 11 may be substantially the same as or similar to the display device according to an embodiment illustrated in FIGS. 3 and 4 except for material and location of the first protection member, such that repeated explanations may be omitted.

Referring to FIG. 11, the display device according to an embodiment may include a first protection member 196. The first protection member 196 may include a first driving protection member 196a, a first switching protection member 196b, a first compensation protection member 196c, a first initialization protection member 196d, a first operation control protection member 196e, a first light emission control protection member 196f, and a first bypass protection member 196g. In comparison with the first protection member 196 according to an embodiment illustrated in FIGS. 3 and 4, the first protection member 196 according to an embodiment may further include the first driving protection member 196a. The first driving protection member 196a may overlap the driving transistor T1 in a plan view.

The first protection member 196 may be between the insulation interlayer 180 and the third conductive layer 191, 192, and 193. Specifically, the first protection member 196 may be on the insulation interlayer 180, the third conductive layer 191, 192, and 193 may be on the insulation interlayer 180 and may cover the first protection member 196, and the first planarization layer 210 may be on the insulation interlayer 180 and may cover the first protection member 196 and the third conductive layer 191, 192, and 193. In an embodiment, the first protection member 196 may be in contact with lower portions of the third conductive layer 191, 192, and 193. For example, the third conductive layer 191, 192, and 193 may be located directly on the first protection member 196.

The first protection member 196 may be formed of inorganic insulating material such as silicon nitride (SiNx), silicon oxide (SiOx), or silicon oxynitride (SiOxNy). The first protection member 196 may include inorganic insulating material, so that the first protection member 196 may not influence electrical signals transmitted through the third conductive layer 191, 192, and 193 despite being in contact with the third conductive layer 191, 192, and 193.

Hereinafter, a detailed structure of a display device according to an embodiment will be described in detail with reference to FIG. 12.

Figure 12:
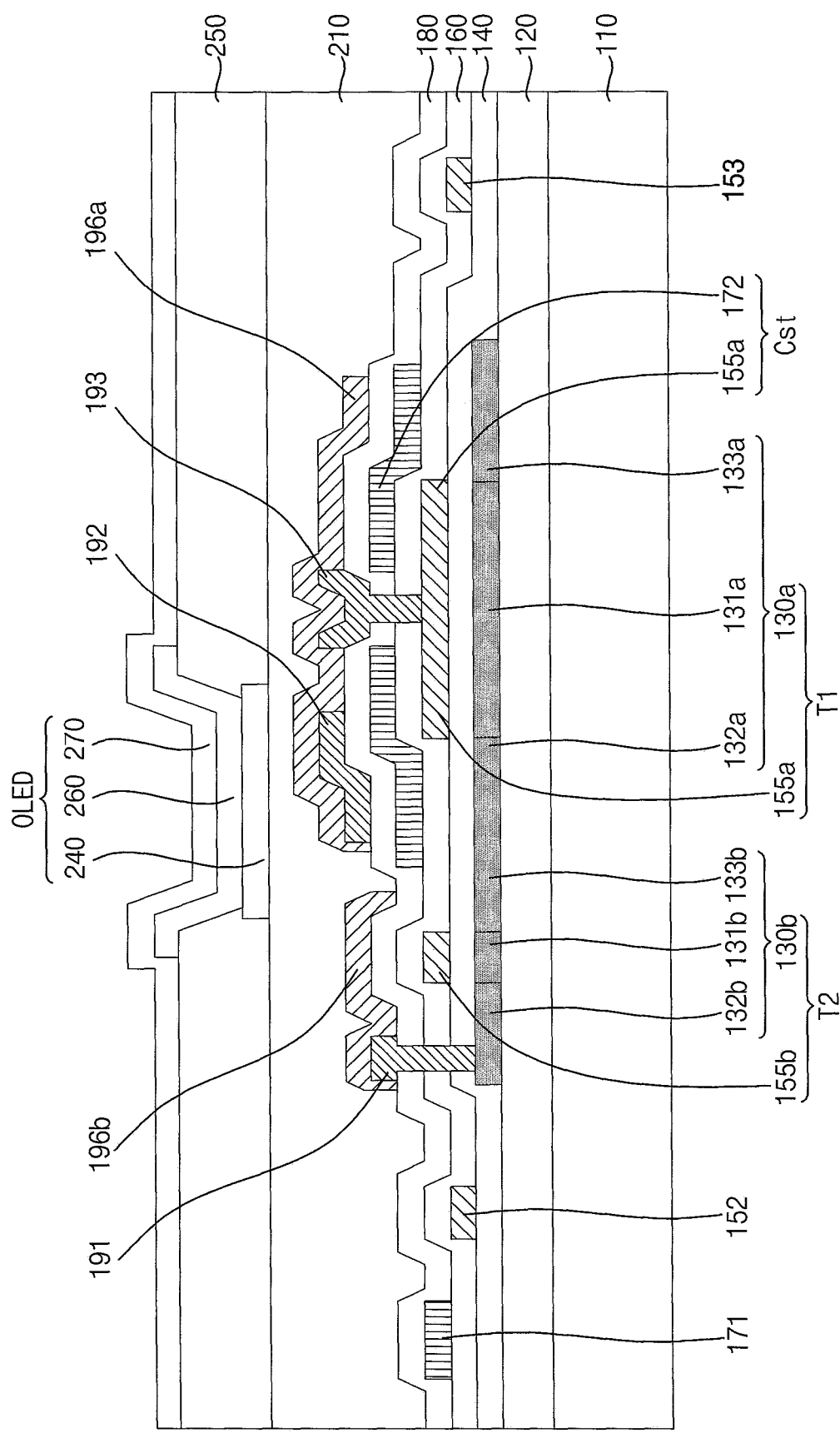
FIG. 12 is a cross-sectional view illustrating a display device according to an embodiment.

FIG. 12 is across-sectional view illustrating a display device according to an embodiment.

A display device according to an embodiment illustrated in FIG. 12 may be substantially the same as or similar to the display device according to an embodiment illustrated in FIG. 11 except for location of the first protection member, such that repeated explanations may be omitted.

Referring to FIG. 12, the first protection member 196 may be between the third conductive layer 191, 192, and 193 and the first planarization layer 210. Specifically, the first protection member 196 may be on the insulation interlayer 180 and may cover the third conductive layer 191, 192, and 193, and the first planarization layer 210 may be on the insulation interlayer 180 and may cover the first protection member 196 and the third conductive layer 191, 192, and 193. In an embodiment, the first protection member 196 may be in contact with upper portions of the third conductive layer 191, 192, and 193. For example, the first protection member 196 may be located directly on the third conductive layer 191, 192, and 193.

The first protection member 196 may be formed of inorganic insulating material such as silicon nitride (SiNx), silicon oxide (SiOx), or silicon oxynitride (SiOxNy). The first protection member 196 may include inorganic insulating material, so that the first protection member 196 may not influence electrical signals transmitted through the third conductive layer 191, 192, and 193 although being in contact with the third conductive layer 191, 192, and 193.

The display device according to embodiments of the present disclosure may be applied to a display device included in a computer, a notebook, a mobile phone, a smartphone, a smart pad, a PMP, a PDA, an MP3 player, or the like.

Although the thin-film substrates and the display devices according to the embodiments of the present disclosure have been described with reference to the drawings, the illustrated embodiments are examples, and may be modified and changed by a person having ordinary knowledge in the relevant technical field without departing from the technical spirit of the present disclosure described in the following claims, functional equivalents thereof to be included.

What is claimed is:

1. A thin-film transistor substrate, comprising:
a substrate;
a transistor on the substrate, and comprising:
an active pattern comprising a channel region; and
a gate electrode insulated from the active pattern;
a data line and a driving voltage line above the gate electrode for respectively transmitting a data signal and a driving voltage;
a first protection member on the transistor, and overlapping the transistor in a plan view, the first protection member being on a same level as and protruding and extending away from one of the data line and the driving voltage line in a plan view; and
a first planarization layer surrounding sides of the first protection member, and having an elastic modulus lower than that of the first protection member,
wherein the first protection member is on the channel region to correspond to the channel region in a plan view.

2. The thin-film transistor substrate of claim 1, wherein the active pattern further comprises a source region, and a drain region.

3. The thin-film transistor substrate of claim 1, wherein the first protection member comprises one of a metal and an inorganic insulating material.

4. The thin-film transistor substrate of claim 1, wherein the first protection member is on a same level as the data line and the driving voltage line, and
wherein the first protection member protrudes from one of the data line and the driving voltage line.

5. The thin-film transistor substrate of claim 1, wherein the first protection member is in contact with an upper portion or a lower portion of one of the data line and the driving voltage line.

6. The thin-film transistor substrate of claim 1, further comprising a second protection member on the first planarization layer and overlapping the transistor in a plan view.

7. The thin-film transistor substrate of claim 6, further comprising a second planarization layer on the second protection member,
wherein an elastic modulus of the second protection member is greater than an elastic modulus of the second planarization layer.

8. The thin-film transistor substrate of claim 6, wherein the second protection member comprises one of a metal and an inorganic insulating material.

9. The thin-film transistor substrate of claim 1, wherein the first planarization layer comprises an organic insulating material.

10. The thin-film transistor substrate of claim 1, wherein the substrate comprises:
a first flexible layer; and
a second flexible layer on the first flexible layer,
wherein the thin-film transistor substrate further comprises a second protection member between the first flexible layer and the second flexible layer, and overlapping the transistor in a plan view.

11. The thin-film transistor substrate of claim 10, wherein an elastic modulus of the second protection member is greater than an elastic modulus of the second flexible layer.

12. The thin-film transistor substrate of claim 1, further comprising:
a buffer layer between the substrate and the active pattern; and
a second protection member between the substrate and the buffer layer, the second protection member overlapping the transistor in a plan view.

13. The thin-film transistor substrate of claim 12, wherein an elastic modulus of the second protection member is greater than an elastic modulus of the buffer layer.

14. A display device, comprising:
a substrate;
a scan line on the substrate for transmitting a scan signal;
a data line and a driving voltage line crossing the scan line for respectively transmitting a data signal and a driving voltage;
a first transistor coupled to the scan line and the data line, and comprising a first active pattern, and a first gate electrode insulated from the first active pattern;
a second transistor coupled to the first transistor, and comprising a second active pattern, and a second gate electrode insulated from the second active pattern;
a first protection member on the first transistor, and overlapping the first transistor in a plan view, the first protection member being on a same level as and protruding and extending away from one of the data line and the driving voltage line in a plan view;
a first planarization layer surrounding sides of the first protection member, and having an elastic modulus lower than that of the first protection member; and
a light emitting element coupled to the second transistor,
wherein the first active pattern comprises a first channel region, and
wherein the first protection member is on the first channel region to correspond to the first channel region in a plan view.

15. The display device of claim 14, wherein the first active pattern further comprises a first source region, and a first drain region.

16. The display device of claim 14, further comprising a second protection member on the first protection member, and overlapping the first transistor in a plan view.

17. The display device of claim 14, further comprising a second protection member inside the substrate, or between the substrate and the first transistor, the second protection member overlapping the first transistor in a plan view.

\* \* \* \* \*